(12) United States Patent
Ng et al.

(10) Patent No.: US 7,519,486 B2
(45) Date of Patent: Apr. 14, 2009

(54) METHOD AND APPARATUS TO TEST THE POWER-ON-RESET TRIP POINT OF AN INTEGRATED CIRCUIT

(75) Inventors: Philip Ng, Cupertino, CA (US); Jinshu Son, Saratoga, CA (US); Liqi Wang, Sunnyvale, CA (US); Johnny Chan, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 322 days.

(21) Appl. No.: 11/278,223

(22) Filed: Mar. 31, 2006

(65) Prior Publication Data

US 2007/0266280 A1    Nov. 15, 2007

(51) Int. Cl.
*G06F 19/00* (2006.01)
*G01R 19/00* (2006.01)

(52) U.S. Cl. .............. 702/64; 702/117; 702/189; 713/340; 714/724; 327/142; 327/143; 324/537; 324/765

(58) Field of Classification Search .................. 702/64, 702/117, 120, 189; 713/340; 714/724; 327/142, 327/143; 324/537, 765
See application file for complete search history.

(56) References Cited

U.S. PATENT DOCUMENTS

| | | | |
|---|---|---|---|
| 5,180,926 A | 1/1993 | Skripek | |
| 5,181,203 A * | 1/1993 | Frenkil | 714/34 |
| 5,349,290 A | 9/1994 | Yamada | |
| 5,450,417 A * | 9/1995 | Truong et al. | 714/724 |
| 5,778,238 A * | 7/1998 | Hofhine | 713/340 |
| 6,137,324 A | 10/2000 | Chung | |
| 6,188,257 B1 | 2/2001 | Buer | |
| 6,236,249 B1 | 5/2001 | Choi et al. | |
| 6,407,571 B1 | 6/2002 | Furuya et al. | |
| 6,515,523 B1 | 2/2003 | Bikulcius | |
| 6,947,863 B2 | 9/2005 | Seitz | |
| 7,015,736 B1 | 3/2006 | Sudjian et al. | |
| 7,091,758 B2 | 8/2006 | Chun et al. | |
| 2005/0035796 A1 | 2/2005 | Chun et al. | |

(Continued)

FOREIGN PATENT DOCUMENTS

JP    2004260648 A    9/2004

(Continued)

OTHER PUBLICATIONS

Vilalte, 'Circuit Design of the Power-On-Reset', Apr. 2000, pp. 1-25.*

(Continued)

*Primary Examiner*—Edward Raymond
*Assistant Examiner*—Elias Desta
(74) *Attorney, Agent, or Firm*—Schwegman, Lunberg & Woessner, P.A.

(57) ABSTRACT

Circuitry for testing a power-on-reset circuit in an integrated circuit includes a high-voltage detector coupled to a first I/O pad of the integrated circuit. A power-on-reset circuit in the integrated circuit has an output coupled to a driver circuit that is powered by the high-voltage. A second I/O pad of the integrated circuit is coupled to the output of the driver circuit. The driver circuit may be enabled by a signal provided on a third I/O pad of the integrated circuit.

33 Claims, 2 Drawing Sheets

U.S. PATENT DOCUMENTS

| | | |
|---|---|---|
| 2006/0041811 A1 | 2/2006 | Hsieh |
| 2007/0216397 A1* | 9/2007 | Chan et al. .................. 324/142 |
| 2007/0252626 A1 | 11/2007 | Chou |

FOREIGN PATENT DOCUMENTS

| | | |
|---|---|---|
| WO | WO-2007/115120 A2 | 10/2007 |

OTHER PUBLICATIONS

Khan et al,, 'A Sequence Independent Power-On-Reset Circuit for Multi-Voltage Systems', Jan. 2006, pp. 1271-1274.*

U.S. Appl. No. 11/375,838 Non-Final Office Action mailed Jan. 7, 2008, 5 pgs.

U.S. Appl. No. 11/375,838 Response filed Apr. 7, 2008 to Non-Final Office Action mailed Jan. 7, 2008, 10 pgs.

* cited by examiner

US 7,519,486 B2

METHOD AND APPARATUS TO TEST THE POWER-ON-RESET TRIP POINT OF AN INTEGRATED CIRCUIT

BACKGROUND OF THE INVENTION

1. Field of the Invention

The present invention relates to integrated circuit technology. More particularly, the present invention relates to circuits and methods for testing on-chip power-on-reset circuits

2. The Prior Art

In an integrated circuit, a power-on-reset circuit is used to generate a negative or positive pulse to reset the entire chip when power is ramping up so that the on-chip circuitry is in a known reset state. The highest $V_{CC}$ at which the whole chip is still in the reset mode is called the power-on-reset trip point.

The power-on-reset trip point can not be set to too low a value because the on-chip circuitry will not be working properly at values of $V_{CC}$ that are too low. In other words, the entire chip will not be reset properly to a known reset state. In addition, the power-on-reset trip point can not be set to too high a value because the on-chip circuitry will still be in reset mode at too high a value of $V_{CC}$.

In order to determine the power-on-reset trip point, the minimum value of $V_{CC}$ at which the chip is still working is characterized during the debugging and qualification stages of the chip development. Due to process variations, including, but not limited to lot-to-lot variations, wafer-to-wafer variations, variations across a wafer, or individual defects, or the sensitivities of the power-on-reset circuit to temperature, layout, or process parameters, the actual power-on-reset trip point may vary from die to die and may be different from the characterized value.

The power-on-reset trip point is not tested, or not 100% tested before shipping. In the prior art, no special power-on-reset trip point test circuit is embedded. The power-on-reset trip point shift, especially shifting to a lower trip point, is causing field application failure.

BRIEF DESCRIPTION OF THE INVENTION

Circuitry for testing a power-on-reset circuit in an integrated circuit includes a high-voltage detector coupled to a first I/O pad of the integrated circuit. A duplicate power-on-reset circuit in the integrated circuit has an output coupled to a driver circuit that is powered by the high-voltage. A second I/O pad of the integrated circuit is coupled to the output of the driver circuit. The driver circuit may be enabled by a signal provided on a third I/O pad of the integrated circuit.

A method for testing a power-on-reset circuit in an integrated circuit according to the present invention includes providing a duplicate power-on-reset circuit; selectively coupling a signal related to the output of the duplicate power-on-reset circuit to an I/O pad on the integrated circuit; and sensing the signal at the I/O pad on the integrated circuit.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
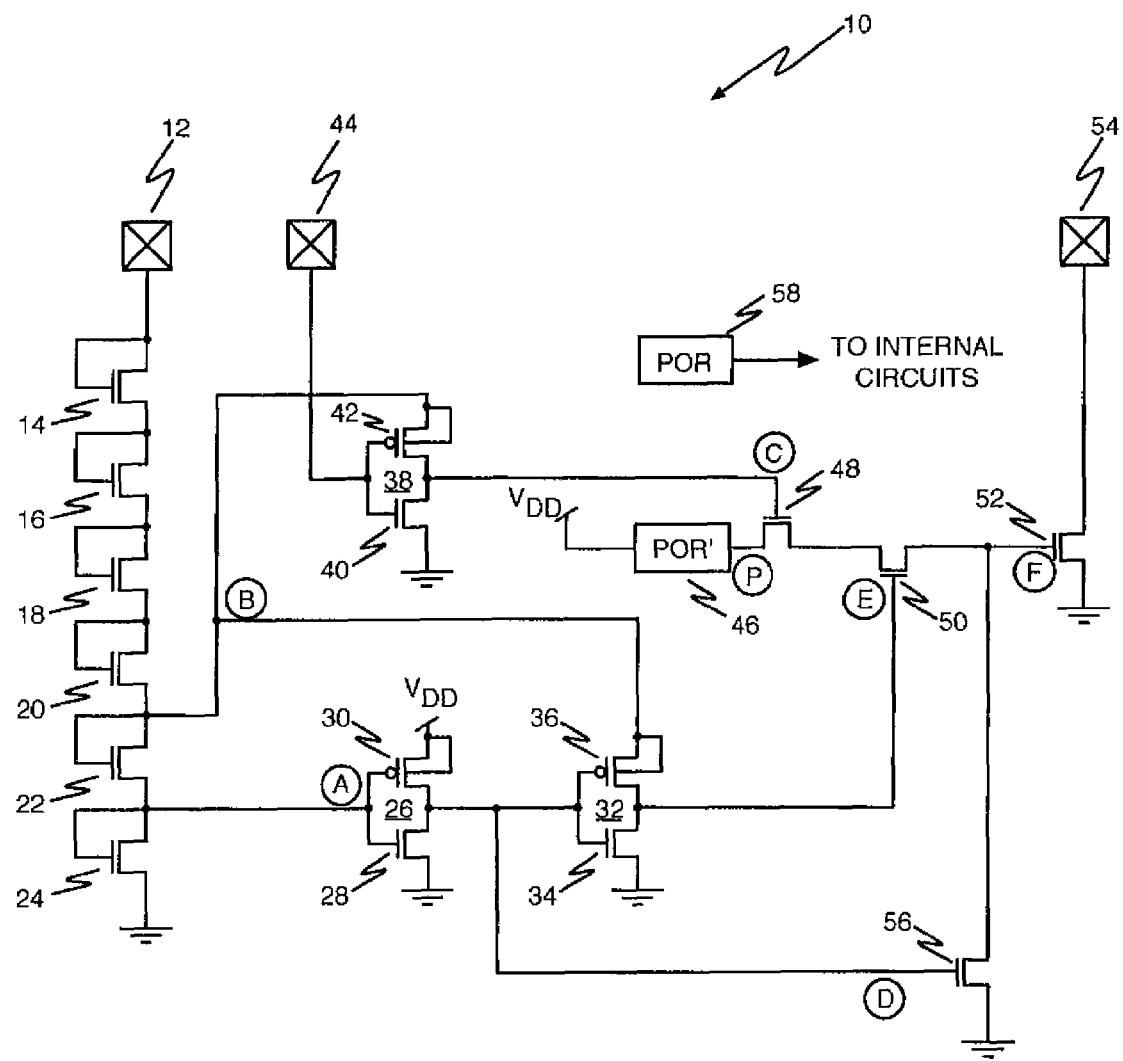
FIG. 1 is a schematic diagram of an illustrative power-on-reset test circuit according to the principles of the present invention.

Referring now to FIG. 1, a schematic diagram shows an illustrative power-on-reset test circuit 10 according to the principles of the present invention. Power-on-reset test circuit 10 includes a first I/O pad 12. A series string of diode-connected n-channel MOS transistors 14, 16, 18, 20, 22, and 24 is connected between the first I/O pad 12 and ground. N-channel MOS transistor 24 is a weak device, i.e., formed at the minimum device size for the process technology employed.

N-channel MOS transistors 14, 16, 18, 20, 22, and 24 together function as a high-voltage detector. If a voltage of, for example, 12 volts, is placed on first I/O pad 12 if high voltage (for example, 12V) is applied to high voltage detector, the voltage at the drain of n-channel MOS transistor 22 will be about 4V and the voltage at the drain of n-channel MOS transistor 24 will be about 2V. If $V_{DD}$ or 0V is applied to first I/O pad 12, the voltage at the drain of n-channel MOS transistor 22 will be about 1V and the voltage at the drain of n-channel MOS transistor 24 will be about 3V.

A first inverter 26 includes n-channel MOS transistor 28 and p-channel MOS transistor 30. First inverter 26 is powered by $V_{DD}$ and has an input coupled to the drain of n-channel MOS transistor 24. The n-well containing p-channel MOS transistor 30 in inverter 26 is biased at $V_{DD}$.

A second inverter 32 includes n-channel MOS transistor 34 and p-channel MOS transistor 36. Second inverter 32 is powered by the voltage at the drain of n-channel MOS transistor 22 and has an input coupled to the output of first inverter 26. The n-well containing p-channel MOS transistor 36 in inverter 32 is biased at the voltage at the drain of n-channel MOS transistor 22.

A third inverter 38 includes n-channel MOS transistor 40 and p-channel MOS transistor 42. Third inverter 38 is powered by the voltage at the drain of n-channel MOS transistor 22 and has an input coupled to a second I/O pad 44. The n-well containing p-channel MOS transistor 42 in inverter 38 is biased at the voltage at the drain of n-channel MOS transistor 22.

A duplicate power-on-reset circuit 46 (POR') has an output coupled to n-channel MOS transistor 48. N-channel MOS transistor 48 is used as a pass gate to transfer the output of duplicate power-on-reset circuit 46. It is preferred to use a duplicate power-on-reset circuit rather than the original power-on-reset circuit in the integrated circuit in order to avoid affecting the performance of the power-on-reset circuit used by the integrated circuit, although the original power-on-reset circuit may be used in accordance with the present invention. The gate of n-channel MOS transistor 48 is driven by the output of third inverter 38.

N-channel MOS transistor 50 is connected in series with n-channel MOS transistor 48. N-channel MOS transistor 50 is also used as a pass gate for the signal out of the duplicate power-on-reset circuit 46. The gate of n-channel MOS transistor 50 is driven by the output of second inverter 32.

After passing through n-channel MOS transistor 48 and n-channel MOS transistor 50, the output of the duplicated power-on-reset circuit 46 is connected to the gate of n-channel MOS pulldown transistor 52. As presently preferred, n-channel MOS pulldown transistor 52 should be a large enough device to make the switching time acceptably small for the test times that are desired to be achieved as will be appreciated by persons of ordinary skill in the art. The source of n-channel MOS pulldown transistor 52 is coupled to ground and its drain is coupled to an I/O pad 54.

N-channel MOS pulldown transistor 56 has its drain coupled to the gate of n-channel MOS pulldown transistor 52, its source coupled to ground, and its gate is driven by the output of first inverter 26. Persons of ordinary skill in the art will appreciate that n-channel MOS pulldown transistor 52 will be turned off if the output of first inverter 26 is a logic "1", since n-channel MOS pulldown transistor 56 will be turned on, pulling the gate of n-channel MOS pulldown transistor 52 to ground. Conversely, such skilled persons will appreciate that n-channel MOS pulldown transistor 56 will be turned off if the output of the first inverter 26 is a logic "0" and the gate of n-channel MOS pulldown transistor 52 will therefore be controlled by the signal at the output of duplicate power-on-reset circuit 46 through pass gate transistors 48 and 50.

FIG. 1 also shows the operational power-on-reset circuit 58 disposed on the integrated circuit. Power-on-reset circuit 58 is coupled to circuits on the integrated circuit to reset them to known states upon power-up of the integrated circuit as is known in the art. Power-on-reset circuit 58 and duplicate power-on-reset circuit 46 are preferably formed using identical components and are disposed near one another or adjacent to one another on the integrated circuit die so that they will have characteristics that are as nearly identical as possible. In this manner, the duplicate power-on-reset circuit 46 can be used for testing with reasonable assurances that its output will closely track the output of power-on-reset circuit 58 that is actually used to perform the reset function in the integrated circuit.

The operation of the illustrative circuit shown in FIG. 1 has two modes, one in which the integrated circuit is in normal operating mode and the other when the integrated circuit is in the power-on-reset trip point test mode. He normal operating mode of the integrated circuit will be disclosed first.

During the normal operating mode of the integrated circuit, I/O pad 12 will be at either $V_{DD}$ or 0V, I/O pad 44 will be at either $V_{DD}$ or 0V, and I/O pad 54 will be in a high impedance state. The drains of n-channel MOS transistors 22 and 24 will be logic "0." Consequently, the input of inverter 26 will be at a logic "0," and its output will be a logic "1." N-channel MOS pulldown transistor 56 will be turned on and n-channel MOS pulldown transistor 52 will thus be turned off. The input to second inverter 32 will be a logic "1" and its output will be at a logic "0," partly because its power supply is turned off. The power supply of third inverter 38 will also be turned off and its output will be at a logic "0." N-channel MOS transistor 50 will be turned off. The output of the duplicate power-on-reset circuit 46 will not be passed to the gate of n-channel MOS transistor 52.

The power-on-reset trip point test according to the present invention is done in a sequence as will be disclosed herein. An exemplary test sequence is disclosed herein. The voltages (for example, 2V, 1V, 1.7V, 1.1V) expressed herein are merely for the purposes of illustration. Persons of ordinary skill in the art will appreciate that other potentials may be used depending on the integrated circuit voltage specifications.

First, the circuit is tested while the integrated circuit should still be in the reset mode. It is desired that the chip is in the reset mode at $V_{DD}$=1.1V assuming that nominal $V_{DD}$ is about 1.7V. Therefore, a $V_{DD}$ voltage of about 1.1V is used for this test.

To perform the test, I/O pad 44 is placed at ground potential and the integrated circuit is powered up or down to $V_{DD}$=1.1V. I/O pad 54 is connected to a tester. A high voltage (e.g., 12V) is applied to I/O pad 12. With 12V at I/O pad 12,
the drain of n-channel MOS transistor 22 is at about 3V and the drain of n-channel MOS transistor 24 is at about 1V. Under these conditions, second and third inverters 32 and 38 will be supplied with power, and the input to the first inverter 26 will be a logic "1," making its output a logic "0." N-channel MOS pulldown transistor 56 will be turned off, allowing the gate of n-channel MOS pulldown transistor 52 to operate. The output of second inverter 32 will be a logic "1," turning on n-channel MOS transistor 50.

Because I/O pad 44 is at ground, the input to third inverter 38 is at a logic "0" and its output is at a logic "1," thus turning on n-channel MOS transistor 48. Because n-channel MOS transistors 48 and 50 are both turned on, the output of duplicate power-on-reset circuit 46 is presented to the gate of n-channel MOS pulldown transistor 52.

Current is forced into I/O pad 54 from the tester. If I/O pad 54 is "high" and will sink no current, the integrated circuit is still in the reset mode because n-channel MOS pulldown transistor 52 is not turned on, assuming that the output of duplicate power-on-reset circuit 46 is low when there is a reset. This means that the power-on-reset trip point is higher than 1.1V and the integrated circuit passes the first checkpoint of the power-on-reset trip point test. If I/O pad 54 is "low" and will sink current, this means that n-channel MOS pulldown transistor 54 is turned on and that the integrated circuit is not in the reset mode. The integrated circuit fails the test because the power-on-reset trip point is lower than 1.1V.

Next, the circuit is tested at a $V_{DD}$ voltage of 1.7V. At this voltage, the integrated circuit should not still be in the reset mode, since 1.7V is the normal operating value of $V_{DD}$. The $V_{DD}$ voltage is raised from 1.1V to 1.7V and the tester again forces current into I/O pad 54. If I/O pad 54 is "low" and will sink current, n-channel MOS pulldown transistor 52 is turned on and the integrated circuit has exited the reset mode. This means that the power-on-reset trip point is lower than 1.7V and the integrated circuit passes the second checkpoint of the power-on-reset trip point test. If I/O pad 54 is "high" and will not sink current, n-channel MOS pulldown transistor 52 is still off, meaning that the integrated circuit is still in the reset mode. The integrated circuit fails the test because the power-on-reset trip point is higher than 1.7V, and that will affect normal operation at $V_{DD}$=1.7V.

If the integrated circuit passes both checkpoints, it means the power-on-reset trip point is higher than 1.1V and below 1.7V. Persons of ordinary skill in the art will observe that the test can be performed at other intermediate values of $V_{DD}$ to more precisely identify the trip point of the power-on-reset circuit.

Figure 2:
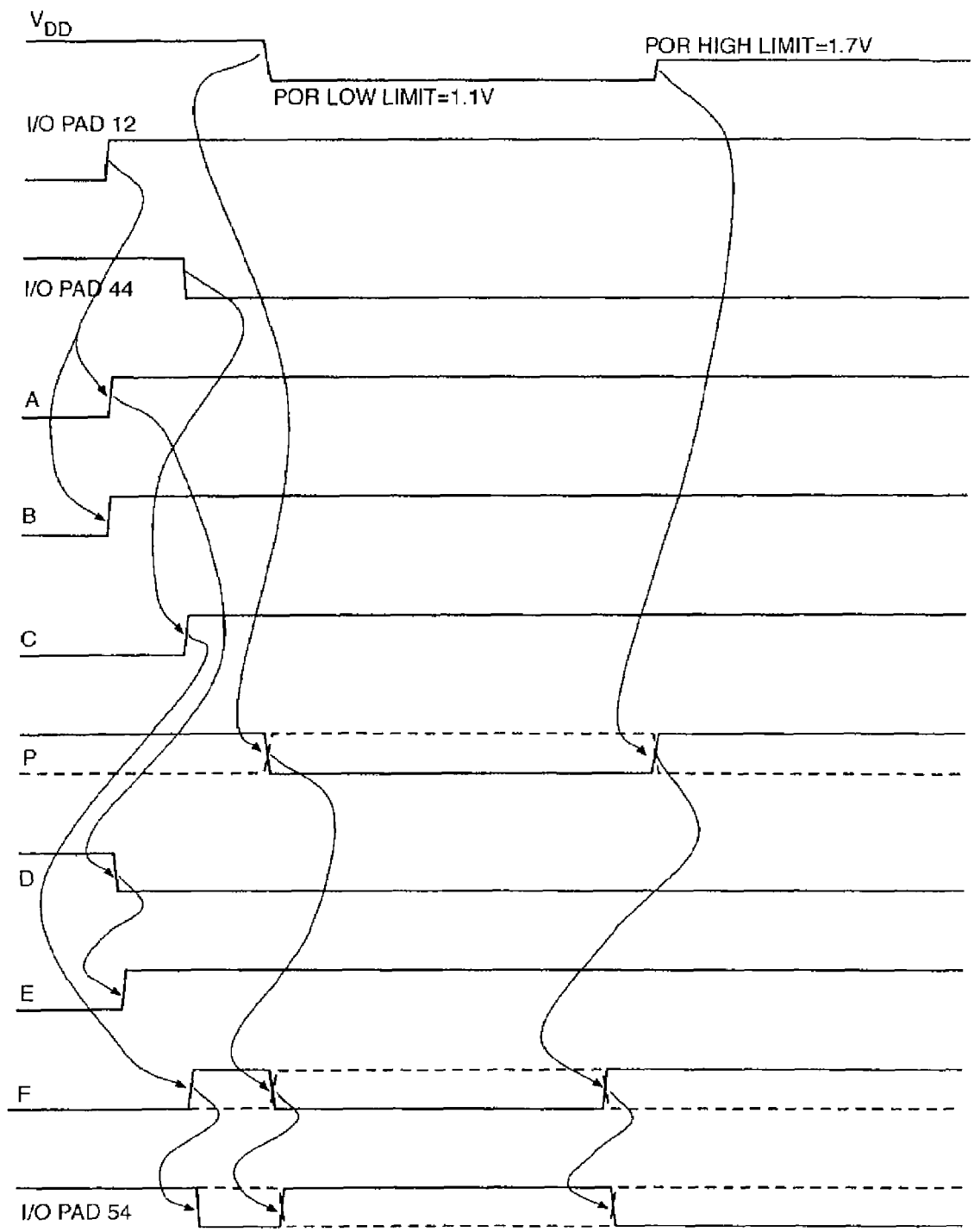
FIG. 2 is a timing diagram illustrating the waveforms at selected circuit nodes to help explain the operation of the present invention.

Referring now to FIG. 2, a timing diagram illustrates the waveforms at selected circuit nodes to help explain the operation of the present invention. The first trace represents the waveform present at the $V_{DD}$ node of the integrated circuit. The second trace represents the waveform present at I/O pad 12 of the integrated circuit, which triggers a test event. The third trace represents the waveform present at I/O pad 44 of the integrated circuit. The fourth trace represents the waveform present at circuit node "A" of the integrated circuit, which is located at the input to inverter 26. The fifth trace represents the waveform present at circuit node "B" of the integrated circuit, which is located at the source of the p-channel MOS transistor 36 of inverter 32. The sixth trace represents the waveform present at circuit node "C" of the integrated circuit, which is located at the gate of the n-channel MOS transistor 48. The seventh trace represents the waveform present at circuit node "P" of the integrated circuit, which is located at the output of POR' circuit 46. The eighth trace represents the waveform present at circuit node "D" of the integrated circuit, which is located at the output of inverter 26. The ninth trace represents the waveform present at circuit node "E" of the integrated circuit, which is located at the input to inverter 32. The tenth trace represents the waveform present at circuit node "F" of the integrated circuit, which is located at the gate of the n-channel MOS transistor 52. Finally, the eleventh trace represents the waveform present at I/O pad 54 of the integrated circuit. FIG. 2 provides an illustration of the operation of the circuit of FIG. 1 in the manner previously described.

The solid-line trace at node P represents the case where a low output from the POR circuit indicates a reset state. The dashed lines present in the traces for nodes P, F, and I/O pad 54 illustrate an embodiment where a high output from the POR circuit indicates a reset state.

The present invention provides several advantages. By employing the present invention, the power-on-reset trip point of every integrated circuit can be tested before shipping with a simple and short "go/no-go" test. In addition, field failure due to shifting of the power-on-reset trip point with time, especially a shift to a lower trip point, can be scanned and prevented. Finally, the short test time means cost savings to the manufacturer.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A circuit for testing a power-on-reset circuit in an integrated circuit including:
    a duplicate power-on-reset circuit disposed on the integrated circuit and having an output;
    a high-voltage detector circuit coupled to a first I/O pad of the integrated circuit; and
    a driver circuit disposed on the integrated circuit and coupled to the output of the duplicate power-on-reset circuit, the driver circuit powered by high-voltage presented on the first I/O pad, the driver circuit having an output coupled to a second I/O pad of the integrated circuit.

2. The circuit of claim 1 wherein the driver circuit is enabled by a signal provided on a third I/O pad of the integrated circuit.

3. The circuit of claim 1 wherein the driver circuit includes a pulldown transistor coupled to the second I/O pad of the integrated circuit.

4. The circuit of claim 1 wherein the high-voltage detector circuit includes a series-connected string of diodes connected between the first I/O pad and ground.

5. The circuit of claim 4 wherein the series-connected string of diodes comprises a string of n-channel MOS transistors.

6. A circuit for testing a power-on-reset circuit in an integrated circuit including:
    a high-voltage detector circuit coupled to a first I/O pad of the integrated circuit; and
    a driver circuit disposed in the integrated circuit and coupled to the output of the power-on-reset circuit, the driver circuit powered by high-voltage presented on the first I/O pad, the driver circuit having an output coupled to a second I/O pad of the integrated circuit.

7. The circuit of claim 6 wherein the driver circuit is enabled by a signal provided on a third I/O pad of the integrated circuit.

8. The circuit of claim 6 wherein the driver circuit includes a pulldown transistor coupled to the second I/O pad of the integrated circuit.

9. The circuit of claim 6 wherein the high-voltage detector circuit includes a series-connected string of diodes connected between the first I/O pad and ground.

10. The circuit of claim 9 wherein the series-connected string of diodes comprises a string of series-connected n-channel MOS transistors each in a diode configuration.

11. A method for testing a power-on-reset circuit, comprising:
    selectively coupling, using pass gates, a signal related to an output of a duplicate power-on-reset circuit to an I/O pad on an integrated circuit;
    controlling the pass gates using inverter circuits; and
    sensing the signal at the I/O pad on the integrated circuit.

12. The method of claim 11 wherein sensing the signal at the I/O pad on the integrated circuit includes sensing flow of current at the I/O pad on the integrated circuit.

13. A method for testing a power-on-reset circuit in an integrated circuit comprising:
    providing a duplicate power-on-reset circuit in the integrated circuit;
    selectively coupling a signal related to output of the duplicate power-on-reset circuit to an I/O pad on the integrated circuit;
    sensing a signal at the I/O pad on the integrated circuit;
    wherein selectively coupling a signal related to the output of the duplicate power-on-reset circuit to an I/O pad on the integrated circuit includes:
        presenting a high voltage at another I/O pad of the integrated circuit; and
        coupling a signal related to the output of the duplicate power-on-reset circuit to an I/O pad on the integrated circuit in response to the presence of high voltage at the another I/O pad of the integrated circuit.

14. A method for testing a power-on-reset circuit in an integrated circuit, comprising:
    receiving a high voltage at a high voltage I/O;
    grounding a test I/O;
    selectively coupling, based on the high voltage and grounded test I/O, a signal related to an output of the power-on-reset circuit to an test I/O pad on the integrated circuit; and
    sensing a signal at the test I/O pad on the integrated circuit.

15. The method of claim 14 wherein sensing the signal at the test I/O pad on the integrated circuit includes sensing flow of current at the test I/O pad on the integrated circuit.

16. A method for testing a power-on-reset circuit in an integrated circuit, comprising:
    selectively coupling a signal related to an output of the power-on-reset circuit to an I/O pad on the integrated circuit;
    sensing a signal at the I/O pad on the integrated circuit; and
    wherein selectively coupling a signal related to the output of the power-on-reset circuit to an I/O pad on the integrated circuit includes:
        presenting a high voltage at another I/O pad of the integrated circuit; and
        coupling a signal related to the output of the power-on-reset circuit to an I/O pad on the integrated circuit in response to presence of high voltage at the another I/O pad of the integrated circuit.

17. The method of claim 16, wherein sensing the signal at the I/O pad on the integrated circuit includes sensing the flow of current at the I/O pad on the integrated circuit.

18. The method of claim 16, wherein selectively coupling includes coupling through a pulldown transistor coupled to the another I/O pad of the integrated circuit.

19. The method of claim 16, wherein selectively coupling includes coupling through a series-connected string of diodes connected between the I/O pad and ground.

20. The circuit of claim 19, wherein the series-connected string of diodes comprises a string of series-connected n-channel MOS transistors, each in a diode configuration.

21. The method of claim 13, wherein sensing the signal at the I/O pad on the integrated circuit includes sensing the flow of current at the I/O pad on the integrated circuit.

22. The method of claim 13, wherein selectively coupling includes coupling through a pulldown transistor coupled to the another I/O pad of the integrated circuit.

23. The method of claim 13, wherein selectively coupling includes coupling through a series-connected string of diodes connected between the I/O pad and ground.

24. The circuit of claim 23, wherein the series-connected string of diodes comprises a string of series-connected diode connected n-channel MOS transistors.

25. An integrated circuit for testing a power-on-reset circuit, comprising:
   a first I/O pad;
   a second I/O pad;
   a third I/O pad;
   a power-on-reset circuit;
   a duplicate power-on-reset circuit having an output;
   a high-voltage detector circuit coupled to the first I/O pad; and
   a driver circuit coupled to the output of the duplicate power-on-reset circuit, the driver circuit powered by a high-voltage presented on the first I/O pad, the driver circuit including an output and a pulldown transistor both coupled to the second I/O pad, and the driver circuit including an enable input connected to the third I/O pad.

26. The circuit of claim 25, wherein the high-voltage detector circuit includes a series- Connected string of diodes connected between the first I/O pad and ground.

27. The circuit of claim 26, wherein the series-connected string of diodes comprises n- Channel MOS transistors.

28. The circuit of claim 27, wherein the driver circuit includes a first inverter connected to the string of diodes at a first node, a second inverter connected to the first inverter and powered by a second node of the string of diodes, a third inverter connected to the second I/O and powered by the second node of the string of diodes.

29. The circuit of claim 28, wherein the driver circuit includes a first pass circuit controlled by the third inverter and connected to the output of the duplicate power-on-reset circuit, a second pass circuit controlled by the second inverter and connected to the gate of the pulldown transistor.

30. The circuit of claim 25, wherein the high voltage is about 12 volts.

31. The circuit of claim 25, wherein the power-on-reset circuit is coupled to internal circuits to reset them to known states at power-up.

32. The circuit of claim 25, wherein the duplicate power-on-reset circuit and the power-on-reset circuit comprise identical components.

33. The circuit of claim 5, wherein the string of n-channel MOS transistors are each in a diode configuration.

* * * * *

UNITED STATES PATENT AND TRADEMARK OFFICE
CERTIFICATE OF CORRECTION

PATENT NO. : 7,519,486 B2  Page 1 of 1
APPLICATION NO. : 11/278223
DATED : April 14, 2009
INVENTOR(S) : Ng et al.

It is certified that error appears in the above-identified patent and that said Letters Patent is hereby corrected as shown below:

On the face page, in field (74), in "Attorney, Agent, or Firm", in column 2, line 1, delete "Lunberg" and insert -- Lundberg --, therefor.

In column 1, line 10, after "circuits" insert -- . --.

In column 3, line 46, delete ""0,"" and insert -- "0" --, therefor.

In column 8, line 6, in Claim 26, delete "series- Connected" and insert -- series-connected --, therefor.

In column 8, line 9, in Claim 27, delete "n- Channel" and insert -- n-channel --, therefor.

Signed and Sealed this

Twenty-eighth Day of July, 2009

JOHN DOLL
*Acting Director of the United States Patent and Trademark Office*